US009086448B2

(12) United States Patent
Huang et al.

(10) Patent No.: US 9,086,448 B2
(45) Date of Patent: Jul. 21, 2015

(54) METHOD FOR PREDICTING RELIABLE LIFETIME OF SOI MOSFET DEVICE

(75) Inventors: Ru Huang, Beijing (CN); Dong Yang, Beijing (CN); Xia An, Beijing (CN); Xing Zhang, Beijing (CN)

(73) Assignee: Peking University, Beijing (CN)

( * ) Notice: Subject to any disclaimer, the term of this patent is extended or adjusted under 35 U.S.C. 154(b) by 556 days.

(21) Appl. No.: 13/504,433

(22) PCT Filed: Nov. 30, 2011

(86) PCT No.: PCT/CN2011/083250
§ 371 (c)(1),
(2), (4) Date: Apr. 26, 2012

(87) PCT Pub. No.: WO2013/056490
PCT Pub. Date: Apr. 25, 2013

(65) Prior Publication Data
US 2013/0103351 A1   Apr. 25, 2013

(30) Foreign Application Priority Data

Oct. 21, 2011   (CN) .......................... 2011 1 0322634

(51) Int. Cl.
*G01R 31/26* (2014.01)
*G06F 19/00* (2011.01)
*G01R 31/28* (2006.01)

(52) U.S. Cl.
CPC ................................... *G01R 31/287* (2013.01)

(58) Field of Classification Search
CPC  G01R 31/287; H01L 21/265; H01L 29/0619; H01L 29/0638; H01L 29/0661; H01L 29/36; H01L 29/404; H01L 29/66325; H01L 29/66333; H01L 29/7393; H01L 29/7395; H03L 5/00
USPC ............... 702/60, 64, 99, 130–132, 136, 182; 324/719, 750.06, 750.07; 257/355; 438/14
See application file for complete search history.

(56) References Cited

U.S. PATENT DOCUMENTS 5,497,076 A   3/1996  Kuo et al.
5,650,336 A   7/1997  Eriguchi et al.
(Continued)

FOREIGN PATENT DOCUMENTS

CN          1568430 A     1/2005
CN        101089642 A    12/2007
(Continued)

OTHER PUBLICATIONS

Lv et al., "Research on Life Prognosis Method for Electronics Based on Dynamic Damage and Optimization AR Model", School of Mechanical and Electronic Engineering and Automation, National University of Defense Technology, Changsha 410073, Hunan, China, ACTA Armamentarii, Jan. 2009, vol. 30 No. 1.
(Continued)

*Primary Examiner* — John H Le
(74) *Attorney, Agent, or Firm* — Bret E. Field; Bozicevic, Field & Francis LLP

(57) ABSTRACT

A method for predicting a reliable lifetime of a SOI MOSFET device including: measuring a relationship of a gate resistance of the device varying as a function of a temperature at different wafer temperatures; performing a lifetime accelerating test on the device at different wafer temperatures, so as to obtain a degenerating relationship of a parameter representing the lifetime of the device as a function of stress time, and obtain a lifetime in the presence of self-heating when the parameter degenerates to 10%; performing a self-heating correction on the measured lifetime of the device by using the measured self-heating temperature and an Arrhenius model, so as to obtain a lifetime without self-heating influence; performing a self-heating correction on a variation of the drain current caused by self-heating; performing a self-heating correction on an impact ionization rate caused by hot carriers; and predicting the lifetime of the device under a bias.

5 Claims, 4 Drawing Sheets

(56) References Cited

U.S. PATENT DOCUMENTS

| | | | |
|---|---|---|---|
| 6,456,104 | B1 | 9/2002 | Guarin et al. |
| 7,820,457 | B2 * | 10/2010 | Chen et al. ............... 438/14 |
| 8,106,461 | B2 * | 1/2012 | Chen et al. ............... 257/355 |

FOREIGN PATENT DOCUMENTS

| | | |
|---|---|---|
| CN | 102073004 A | 5/2011 |
| JP | 9246342 A | 9/1997 |
| JP | 9330964 A | 12/1997 |
| JP | H10226250 A | 8/1998 |
| JP | H111722 A | 1/1999 |
| JP | H1178847 A | 3/1999 |
| WO | WO03038459 A1 | 5/2003 |

OTHER PUBLICATIONS

Study on Arrhenius relationship, Beijing Univeristy of Aeronautics and Astronautics, Beijing 100083, China, Dec. 2005, No. 6.

* cited by examiner

US 9,086,448 B2

METHOD FOR PREDICTING RELIABLE LIFETIME OF SOI MOSFET DEVICE

FIELD OF THE INVENTION

An embodiment of the invention relates to the technical field of semiconductor reliability. Since the self-heating effect of a SOI MOSFET device exacerbates the degradation degree of the device, while in a practical digital circuit the influence of the self-heating effect is very small, the embodiment of the invention mainly relates to a method for predicting a reliable lifetime of the SOI MOSFET device after a self-heating correction.

BACKGROUND OF THE INVENTION

With a rapid development of Very Large Scale Integrated circuits (VLSI) technology, the silicon integrated circuit process has entered a product manufacturing stage generally based on a feature size of deep submicron and even to ultra-deep submicron. The progress of fabrication process greatly increases quality and performance of VLSI while dramatically reduces the process cost of an individual chip, thus promotes the product popularization of integrated circuit and brings a new electronic information revolution. However, the operation voltage is not able to be scaled down in a proportion while the size of the device is scaled down. Therefore, various reliability problems are gradually becoming more serious, mainly including the hot carrier effect (HCI), the negative bias thermal instability (NBTI) and an time dependent dielectric breakdown (TDDB), etc.

SOI MOSFET device is a structure in which a monocrystalline silicon film is formed over an insulating substrate or a monocrystalline silicon film is formed over a supporting silicon substrate with an insulating layer interposed therebetween for separation. Compared with a conventional bulk silicon MOS device, the SOI MOSFET has advantages such as a good characteristic of electrical isolation, a small parasitic capacitance, easy to form a shallow junction, capable of avoiding latch-up effect and a good capability of radiation resistance and so on. However, due to the quite lower thermal conductivity of buried oxide layer in the SOI MOSFET device, the lattice temperature of a channel region in the device rises, resulting in a decrease of the on-state drain current of the device.

An essential idea of the accelerated lifetime testing is to extrapolate the feature of the lifetime in a normal stress level by using the feature of the lifetime in a high stress level. A key of achieving the essential idea is to establish a relationship between the feature of the lifetime and the stress level, i.e. an acceleration model. In the conventional stress acceleration process, the applied stress condition is a direct current (DC) voltage, and a corresponding time to failure (TTF) is used to predict the lifetime for the device applied into a digital circuit and an analog circuit. However, an error may occurr when predicting a logic circuit or an AC analog circuit operated in real world by the method. The reason is that, the generation of the self-heating effect is associated with the frequency of the operating circuit. More specifically, if the operating frequency is higher, the thermal response of the device is conducted so soon that a signal has not been built yet. Meanwhile, if the operating frequency is lower, the self-heating effect is getting more serious. Thus, in predicting the lifetime of the digital circuit in the high stress level, the influence on the lifetime from the self-heating effect should be eliminated, so that an accurate value of the reliable lifetime of the SOI MOSFET can be obtained.

SUMMARY OF THE INVENTION

An object of the invention is to provide a method for predicting the reliable lifetime of SOI MOSFETs fabricated by the same process under different bias conditions after the self-heating correction.

A technical solution according to an embodiment of the invention is as follows.

A method for predicting a reliable lifetime of a SOI MOSFET device, comprising:

a) measuring a relationship of a gate resistance of the SOI MOSFET device varying as a function of a temperature at different wafer temperatures $T_{wafer}$ to obtain a resistance-temperature relationship coefficient α and a self-heating temperature $T_{sh}$ at different biases; and measuring the substrate current $I_{sub,sh}$ and drain current $I_{d,sh}$ in the presence of self-heating;

b) performing a lifetime accelerating test on the SOI MOSFET device at different wafer temperatures $T_{wafer}$, so as to obtain a degenerating relationship of a parameter representing the lifetime of the device as a function of stress time, and obtain the lifetime $\tau_{sh}$ in the presence of self-heating when the parameter degenerates to 10%;

c) performing a self-heating correction on the measured lifetime of the device by using the measured self-heating temperature and an Arrhenius model as shown in formula 1, so as to obtain a lifetime $\tau_{non\_sh}$ after the influence of self-heating is removed:

$$\tau = A_0 \exp(E_a/kT) \quad \text{(formula 1)}$$

$$\tau_{non\_sh} = \tau_{sh} \times \exp\left[\frac{E_a}{k}\left(\frac{1}{T_{wafer}} - \frac{1}{T_{wafer} + T_{sh}}\right)\right] \quad \text{(formula 2)}$$

where in the formula 1, τ is a lifetime, $A_0$ is a coefficient, $E_a$ is activation energy, k is the Bolzmann constant, T is an absolute temperature; and in the formula 2, $\tau_{non\_sh}$ is a lifetime when influence of self-heating is removed, $\tau_{sh}$ is the lifetime in the presence of influence of self-heating, $E_a$ is activation energy which can be obtained by a fitting method, k is the Bolzmann constant, $T_{wafer}$ is a wafer temperature, and $T_{sh}$ is an extracted self-heating temperature;

d) performing a self-heating correction on a variation of a drain current caused by self-heating:

$$\log I_{d,non\_sh} = \log I_{d,sh} - \beta \log T_{sh} \quad \text{(formula 3)}$$

where $I_{d,non\_sh}$ is a drain current when influence of self-heating is removed, $I_{d,sh}$ is a drain current when influence of self-heating is not removed, $T_{sh}$ is an extracted self-heating temperature, and β is a coefficient (may be obtained by a data fitting method);

e) performing a self-heating correction on an impact ionization rate M caused by hot carriers, where $M=I_{sub}/I_d$, $I_{sub}$ is a substrate current, $I_d$ is a drain current, and a formula used for the correction is:

$$\log M_{non\_sh} = \log M_{sh} - \gamma \log T_{sh} \quad \text{(formula 4)}$$

where $M_{non\_sh}$ is an impact ionization rate when influence of self-heating is removed, $M_{sh}$ an impact ionization rate when influence of self-heating is not removed, $T_{sh}$ is an extracted self-heating temperature, and γ is a coefficient (may be obtained by a data fitting method);

f) putting the respective parameters after self-heating correction, such as the lifetime $\tau_{non\_sh}$, the drain current $I_{d,non\_sh}$ and the impact ionization rate $M_{non\_sh}$ into a standard Hu model [1] (as shown in formula 5), where $M_{non\_sh} = I_{sub,non\_sh}/I_{d,non\_sh}$, and constant coefficients A, B in the formulas are obtained by using a fitting method; after the drain current and the substrate current under a certain bias are measured, predicting the lifetime of the SOI MOSFET device under the bias through formula 6:

$$\tau_{non\_sh} \cdot (I_{d,non\_sh}/W) = A \cdot (I_{sub,non\_sh}/I_{d,non\_sh})^{-B} \quad \text{(formula 5)}$$

$$\tau'_{non\_sh} = (A \cdot W/I'_{d,non\_sh})(I'_{sub,non\_sh}/I'_{d,non\_sh})^{-B} \quad \text{(formula 6)}$$

where W is a channel width of the device, $I'_{sub,non\_sh}$, $I'_{d,non\_sh}$ and $\tau'_{non\_sh}$ are the drain current and the substrate current after self-heating correction, and the lifetime after influence of self-heating is removed, respectively, which are to be predicted under a bias condition.

Specifically, in the step a), the measuring the relationship of the gate resistance of the SOI MOSFET device varying as the function of the temperature comprises:

i) as for the SOI MOSFET having five terminals, two ends of a gate are opened with contact holes respectively and applied with a voltage Vg1 and a voltage Vg2 respectively when testing the gate resistance; in order to exclude an influence from a gate tunneling current on detection of a gate current Ig1 and Ig2, the voltages Vg1 and Vg2 are set as Vg1=Vg+ΔVg and Vg2=Vg−ΔVg, where Vg is the stress bias applied to the gate, and ΔVg takes different values respectively to measure the gate currents Ig1$i$ and Ig2$i$ ($i$=1, 2, 3, . . . , n); and $Rg_i = 4\Delta Vg_i/(Ig1_i + Ig2_i)$ is obtained, where $Rg_i$ is the resistance measured at the ith time; and the gate resistance under a certain temperature and a certain bias is obtained as $$Rg = \sum_{i=1}^{n} Rg_i/n,$$

where n is generally smaller than 5;

ii) performing the step i) at different wafer temperatures when the stress bias for the gate voltage Vg and the drain voltage Vd are zero, so as to obtain a relationship of the gate resistance varying as the function of wafer temperature in the absence of self-heating effect, where the relationship is represented by the resistance-temperature relationship coefficient α:

$$\alpha = \frac{Rg(T_{high}) - Rg(T_{ref})}{T_{high} - T_{ref}} \quad \text{(formula 7)}$$

where $T_{ref}$ is a reference temperature, $Rg(T_{ref})$ is a gate resistance measured at the reference temperature, $T_{high}$ is a temperature higher than the reference temperature, and $Rg(T_{high})$ is a gate resistance measured at $T_{high}$;

iii) performing the step i) at different wafer temperatures when the stress bias for the Vg and Vd are larger than zero, so as to measure the different gate resistances caused by different self-heating effect under different biases; and calculating the self-heating temperature $T_{sh}$ by the resistance-temperature relationship coefficient α and the measured resistance Rg.

$$T_{sh} = \frac{Rg(T_{high}) - Rg(T_{ref})}{\alpha} \quad \text{(formula 8)}$$

In the step a), the stress for testing the reliability is a hot electron injection (HCI) stress.

In the step b), the parameter representing the lifetime of the device is a maximum transconductance $G_{m\_max}$ or a saturation drain current $I_{dsat}$.

In the step i), a value of Vg should be much larger than ΔVg, and the value of ΔVg is smaller than 50 mV.

Compared with the conventional method for testing the lifetime of the SOI MOSFET device, the method provided by embodiments of the invention prevents a self-heating effect from affecting the prediction of a lifetime of a SOI MOSFET device in a practical logic circuit or in an AC analog circuit, which leads to a more precise prediction result.

DETAILED DESCRIPTION OF THE EMBODIMENTS

A preferred embodiment of the invention will be described in more detail with reference to the accompany drawings.

Figure 1:
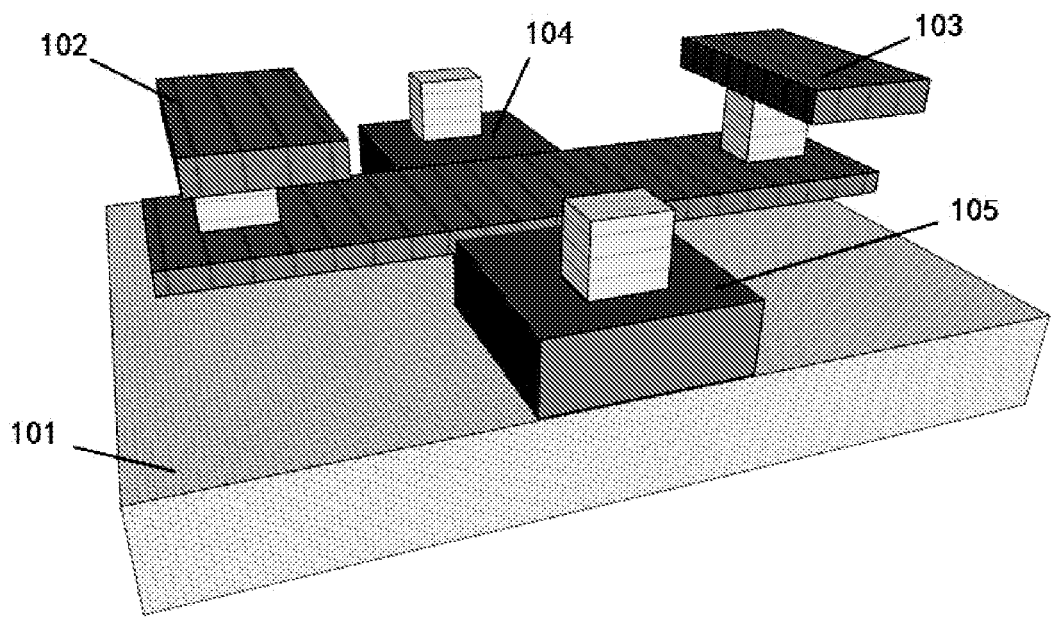
FIG. 1 is a three-dimensional structural diagram of a SOI MOSFET device having body contacts at five terminals, wherein, 101 is a buried layer; 102 is a gate terminal 1; 103 is a gate terminal 2; 104 is a source terminal; and 105 is a drain terminal.

In the embodiment, a SOI MOSFET device to be tested is a SOI NMOS device (a PMOS device is similar to it) having body contacts at five terminals, and a three-dimensional schematic view thereof is shown in FIG. 1. An NMOS transistor having a good process condition and a uniform interface state is selected. The width (W) and the length (L) of the device are 5 μm and 0.18 μm, respectively. The specific implementation steps are as follows.

Figure 2:
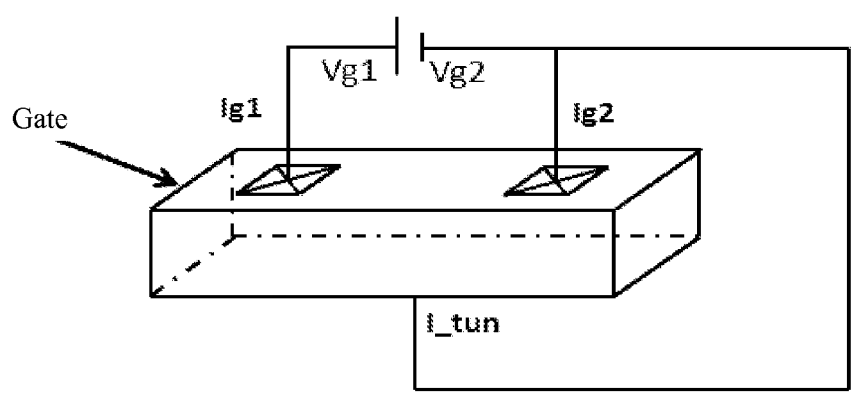
FIG. 2 is a schematic diagram showing extracting a gate resistance.

1) The gate resistances under different wafer temperatures and stress biases are extracted. The method is described as follows. As shown in FIG. 2, a gate 1 and a gate 2 are applied with a voltage Vg1 and a voltage Vg2, respectively. In order to avoid the influence from the gate tunneling current on the detection of a current Ig1 and a current Ig2, the voltages Vg1 and Vg2 are set as Vg1=Vg+ΔVg and Vg2=Vg−ΔVg, where Vg is the stress bias applied to the gate (Vg is much larger than ΔVg), and ΔVg takes a value of 10 mV, 20 mV, 30 mV and 40 mV, respectively. Each of the gate current Ig1$i$ and Ig2$i$ ($i$=1, 2, 3, 4) is measured, and thus each of the gate resistances under different $\Delta Vg$ is obtained: $Rg_i=4\Delta Vg_i/(Ig1_i+Ig2_i)$. Therefore, the gate resistance under a certain stress bias Vg is obtained as $$Rg = \sum_{i=1}^{n} Rg_i/n.$$

2) The wafer temperature is set as T1=303K, T2=323K, T3=353K and T4=383K respectively, and the voltages are set as $V_g=V_d=V_{stress}=0$, where $V_{stress}$ is the stress bias. The step 1) is performed at each of the above-mentioned temperatures, and thus a relationship of the gate resistance varying as a function of the temperature (the wafer temperature) in the absence of self-heating can be obtained, as shown in table 1. A constant of the resistance-temperature relationship coefficient is obtained as $$\alpha = \frac{Rg(T_{high}) - Rg(T_{ref})}{T_{high} - T_{ref}} = 0.69.$$

Figure 3:
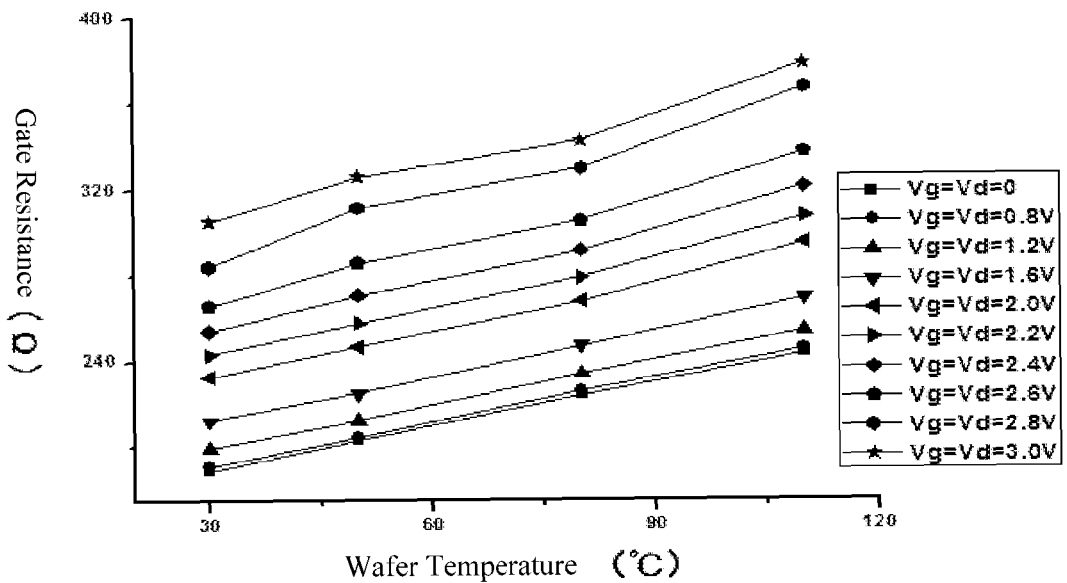
FIG. 3 is a graph showing a relationship between a gate resistance and a wafer temperature.

Then, the value of the $V_{stress}$ is changed to 0.8V, 1.2V, 1.6V, 2.0V, 2.2V, 2.4V, 2.6V, 2.8V and 3.0V, respectively, and similarly, the different gate resistances at each of various wafer temperatures are measured. Thus, a graph showing a distribution of the resistance and the temperature can be obtained according to the constant of the resistance-temperature relationship coefficient, as shown in FIG. 3.

TABLE 1

| | Temperature(K) | | | |
|---|---|---|---|---|
| | T1 = 303 K | T2 = 323 K | T3 = 353 K | T4 = 383 K |
| Resistance (Vstress = 0) | 189.08646 | 203.12357 | 224.06666 | 243.25747 |

TABLE 2

| Temperature | Vg = Vd = 0 | Vg = Vd = 2.4 | Vg = Vd = 2.6 | Vg = Vd = 2.8 | Vg = Vd = 3.0 V |
|---|---|---|---|---|---|
| 30° | 0 | 98.68 K | 128.74 K | 152.83 K | 176.51 K |
| 50° | 0 | 99.62 K | 123.64 K | 159.01 K | 180.53 K |
| 80° | 0 | 99.29 K | 121.55 K | 155.41 K | 174.33 K |
| 110° | 0 | 101.36 K | 121.93 K | 161.670 K | 179.88 K |

3) The wafer temperature is set as T1=303K, and an HCI reliability test is performed on the SOI MOSFET device. The HCI stress bias ($V_g=V_d=V_{stress}$=2.6V, 2.8V, 3.0V) is applied. The source terminal and the body terminal are grounded, and the back gate is floated. The stress time is set to 6000 s. During applying the HCI stress bias, the gate current $I_g$, the substrate current $I_{sub}$ and the drain current $I_d$ are sampled. Meanwhile, the HCI stress bias is interrupted at time points t=1 s, 2 s, 5 s, 10 s, 20 s, 50 s, 100 s, 200 s, 500 s, 1000 s, 2000 s, 4000 s and 6000 s to measure a transfer curve of the device, and thus to obtain a curve of a maximum transconductance degenerating as the function of the stress time, as shown in FIG. 4.

Figure 4:
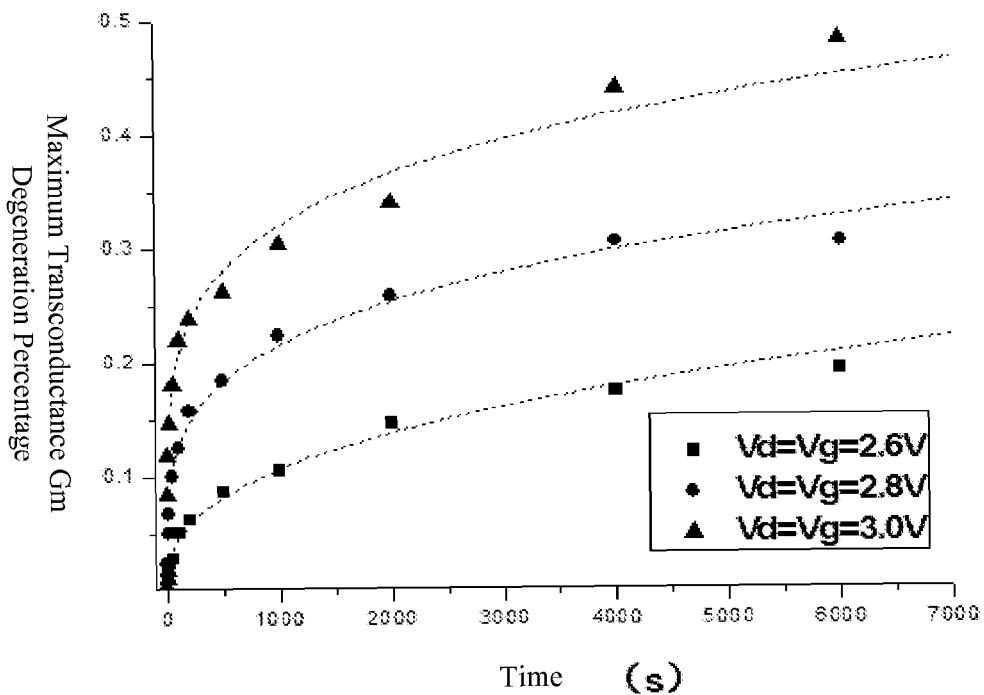
FIG. 4 is a graph showing a maximum transconductance of the device degenerating as a function of the stress time.
Figure 5:
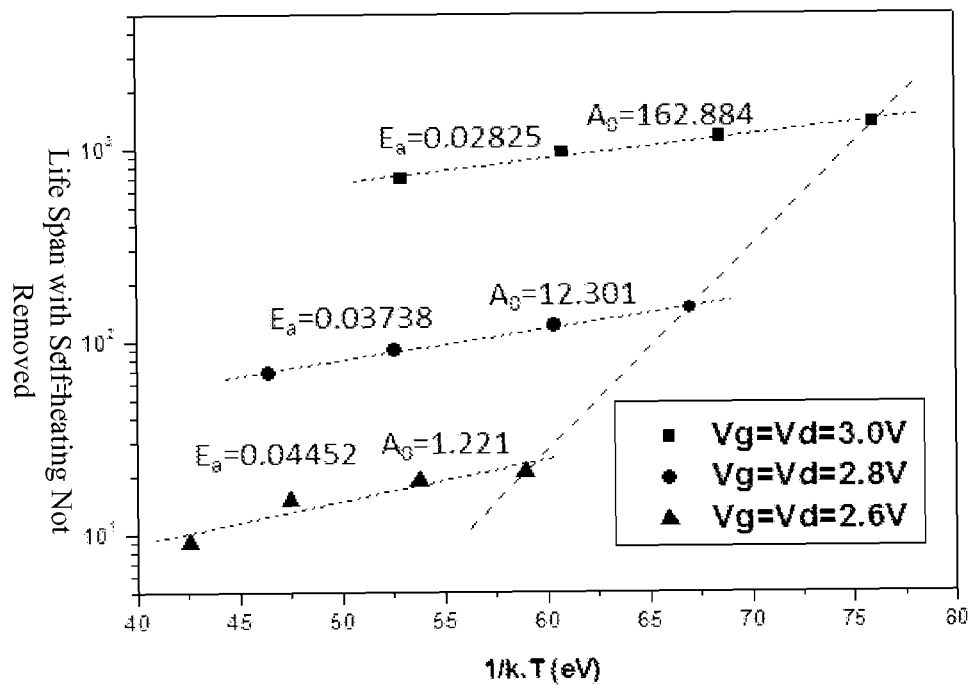
FIG. 5 is a graph showing an Arrhenius relationship between the lifetime and the temperature.

4) The step 3) is repeated at other wafer temperatures T2=323K, T3=353K, and T4=383K, and thus a temporal degenerating graph, which is similar to FIG. 4, is obtained. A time point at which the maximum transconductance is degenerated to 10% is selected as the lifetime end value. According to a relationship between the lifetime and the temperature in the Arrhenius model (as shown in formula 1), FIG. 5 is drawn to obtain a coefficient $A_0$ and activation energy $E_a$ under different stresses by a fitting method.

Meanwhile, by means of formula 2 and the extracted activation energy $E_a$, $$\tau_{non\_sh} = \tau_{sh} \times \exp\left[\frac{E_a}{k}\left(\frac{1}{T_{wafer}} - \frac{1}{T_{wafer} + T_{sh}}\right)\right],$$

a lifetime with self-heating not removed and a lifetime with self-heating removed are obtained as follows.

TABLE 3

| | 2.6 V | | 2.8 V | | 3.0 V | |
|---|---|---|---|---|---|---|
| Temperature (K) | Lifetime with self-heating not removed | Lifetime with self-heating removed | Lifetime with self-heating not removed | Lifetime with self-heating removed | Lifetime with self-heating not removed | Lifetime with self-heating removed |
| 303 | 1350 s | 12488.41 s | 147 s | 1874.72 s | 21 s | 326.15 s |
| 323 | 1150 s | 5638.28 s | 120 s | 835.70 s | 19 s | 162.22 s |
| 353 | 950 s | 2460.94 s | 90 s | 339.93 s | 15 s | 70.06 s |
| 383 | 700 s | 1157.24 s | 68 s | 168.38 s | 9 s | 27.68 s |

According a formula $$\Delta T_{sh} = \frac{Rg(T_{high}) - Rg(T_{ref})}{\alpha},$$

self-heating temperatures under the stress bias of 2.4V, 2.6V, 2.8V and 3.0V at each of different wafer temperatures can be extracted. From FIG. 3 it can be seen that, at various wafer temperatures, the self-heating temperatures generated under the same bias are substantially the same.

Figure 6:
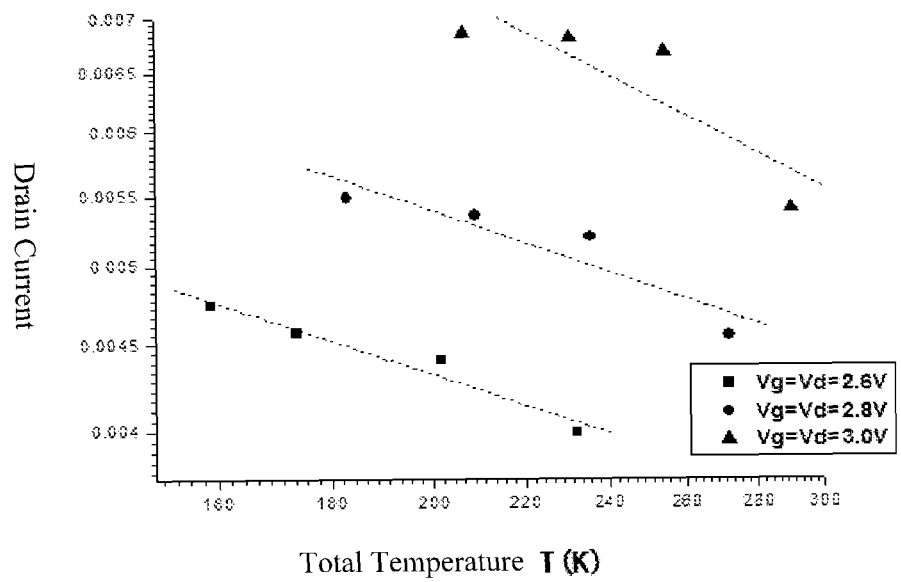
FIG. 6 is a graph showing a relationship between the drain current and the temperature.

5) According to the drain current measured in the step 3), a graph showing a relationship between the drain current and different temperatures is obtained as shown in FIG. 6. It can be seen that, the temperature and the drain current exhibit a double logarithm linearity relationship $\log I_d = C + \beta \log T_{total}$, where C is a constant, $T_{total}$ is a sum of a self-heating temperature and a wafer temperature. According to a coefficient $\beta$ fitted and the self-heating temperature $T_{sh}$ extracted above, a self-heating correction under such a condition can be performed $\log I_{d,non\_sh} = \log I_{d,sh} - \beta \log T_{sh}$. A result of the corrected drain current is shown in table 4.

TABLE 4

| Id, non_sh(A) | T1 = 303 K | T1 = 323 K | T1 = 353 K | T1 = 383 K |
|---|---|---|---|---|
| 2.6 V | 0.004745 A | 0.004569 A | 0.004404 A | 0.003989 A |
| 2.8 V | 0.005485 A | 0.005351 A | 0.005202 A | 0.004548 A |
| 3.0 V | 0.006861 | 0.00681 | 0.006683 | 0.005398 |

Figure 7:
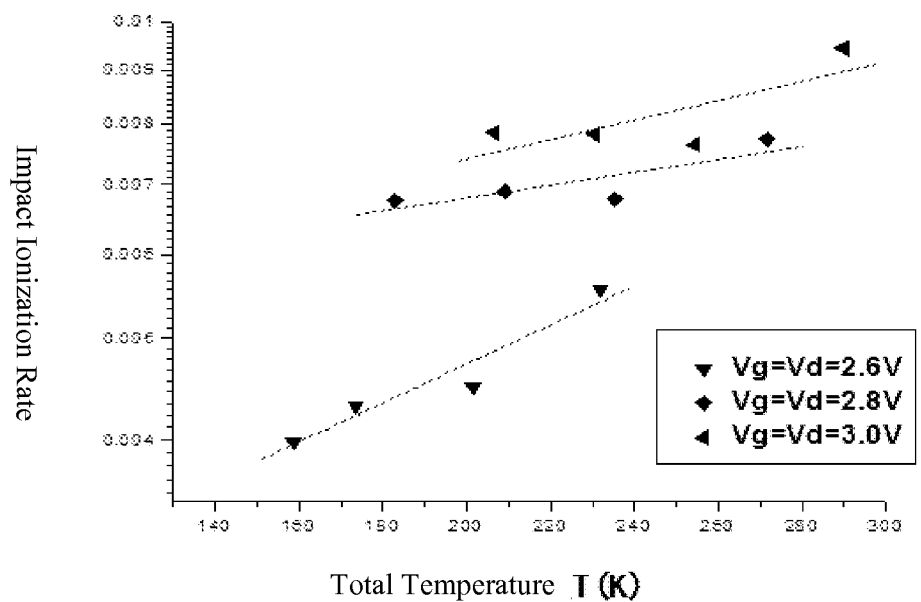
FIG. 7 is a graph showing a relationship between the impact ionization rate and the temperature.

6) According to the measured substrate current and a relationship between an impact ionization rate M and the substrate current and the drain current, a graph showing a relationship of the impact ionization rate M and different temperatures can be obtained (as shown in FIG. 7). It can be found that the temperature and the impact ionization rate also exhibit a double logarithm linearity relationship log M=D+γ log $T_{total}$, where D is a constant. According to a coefficient γ fitted and the self-heating temperature $T_{sh}$ extracted above, a self-heating correction under such a condition can be performed log $M_{non\_sh}$=log $M_{sh}$−γ log $T_{sh}$. A result of the corrected substrate current is shown in table 5.

TABLE 5

| Mnon_sh | T1 = 303 K | T1 = 323 K | T1 = 353 K | T1 = 383 K |
|---|---|---|---|---|
| 2.6 V | 0.003983 A | 0.004312 A | 0.004496 A | 0.005565 A |
| 2.8 V | 0.006764 A | 0.006896 A | 0.006786 A | 0.00774 A |
| 3.0 V | 0.007841 A | 0.007812 A | 0.007646 A | 0.009429 A |

Figure 8:
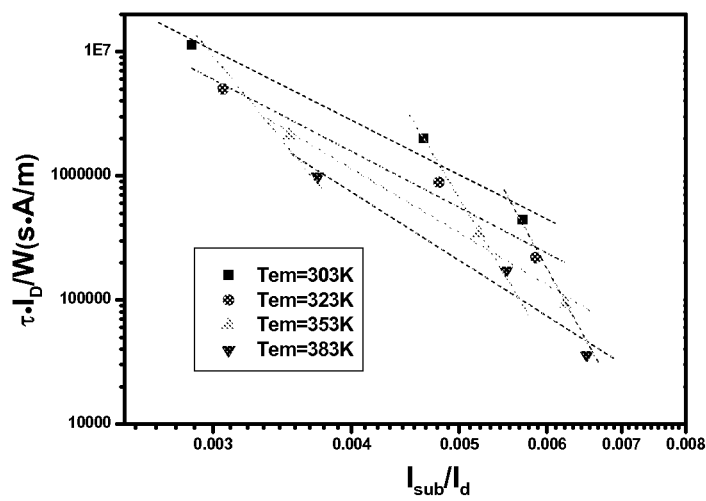
FIG. 8 is a graph showing a relationship of related parameters in the Hu model.

7) The respective corrected values after the self-heating correction of the lifetime, the substrate current and the drain current are put into a Hu model $\tau_{non\_sh} \cdot (I_{d,non\_sh}/W) = A \cdot (I_{sub,non\_sh}/I_{d,non\_sh})^{-B}$, and thus coefficients A and B of the formula at different temperatures can be obtained by a fitting method, respectively shown in FIG. 8 and Table 6.

TABLE 6

|  | A | B |
|---|---|---|
| T1 = 303 K | 3.9684e-5 | 4.52446 |
| T1 = 323 K | 1.0731e-5 | 4.6565 |
| T3 = 353 K | 2.0662e-7 | 5.31375 |
| T4 = 383 K | 1.7779e-8 | 5.67965 |

8) A standard voltage of the SOI MOSFET device is 1.8V. By putting the drain current and the impact ionization rate after self-heating correction into formula 6 $\tau'_{non\_sh} = (A \cdot W/I'_{d,non\_sh})(I'_{sub,non\_sh}/I'_{d,non\_sh})^{-B}$ under an operating condition of room temperature 303K, and by using the coefficients A and B obtained by a fitting method, the lifetime that the maximum transconductance of the device degenerates to 10% under the operating condition can be calculated as about 10 years, which conforms to a life limitation for a normal operation.

Reference

[1] 1985 TED C. Hu "Hot-electron-induced MOSFET degradation—model, monitor, and improvement"

What is claimed is:

1. A method for fabricating a SOI MOSFET device, the method comprising:
   a. fabricating a SOI MOSFET device; and
   b. calculating a prediction of a reliable lifetime of the SOI MOSFET device by:
      i) obtaining a resistance-temperature relationship coefficient α and a self-heating temperature $T_{sh}$ at different biases by determining a relationship of a gate resistance of the SOI MOSFET device varying as a function of a temperature at different wafer temperatures $T_{wafer}$; and obtaining a substrate current $I_{sub,sh}$ and a drain current $I_{d,sh}$ in the presence of self-heating;
   ii) obtaining a degenerating relationship of a parameter representing the lifetime of the device as a function of stress time, and a lifetime $\tau_{sh}$ in the presence of self-heating when the parameter degenerates to 10%, by applying a lifetime accelerating test to the SOI MOSFET device at different wafer temperatures $T_{wafer}$;
   iii) obtaining a lifetime $\tau_{non\_sh}$ after influence of self-heating is removed by correcting obtained lifetime of the device by using the obtained self-heating temperature and an Arrhenius model as shown in formula 1:

$$\tau = A_0 \exp(E_a/kT) \quad \text{(formula 1)}$$

$$\tau_{non\_sh} = \tau_{sh} \times \exp\left[\frac{E_a}{k}\left(\frac{1}{T_{wafer}} - \frac{1}{T_{wafer} + T_{sh}}\right)\right] \quad \text{(formula 2)}$$

where in the formula 1, τ is a lifetime, $A_0$ is a coefficient, $E_a$ is activation energy, k is the Bolzmann constant, T is an absolute temperature; and in the formula 2, $\tau_{non\_sh}$ is a lifetime when influence of self-heating is removed, $\tau_{sh}$ is a lifetime in the presence of influence of self-heating, $E_a$ is activation energy which can be obtained by a fitting method, k is the Bolzmann constant, $T_{wafer}$ is a wafer temperature, and $T_{sh}$ is an extracted self-heating temperature;

iv) correcting a variation of a drain current caused by self-heating according to the following formula 3:

$$\log I_{d,non\_sh} = \log I_{d,sh} - \beta \log T_{sh} \quad \text{(formula 3)}$$

where $I_{d,non\_sh}$ is a drain current when influence of self-heating is removed, $I_{d,sh}$ is a drain current when influence of self-heating is not removed, $T_{sh}$ is an extracted self-heating temperature, and β is a coefficient;

v) correcting an impact ionization rate M caused by hot carriers according to the following formula 4, where M = $I_{sub}/I_d$, $I_{sub}$ is a substrate current, $I_d$ is a drain current, and a formula used for the correction is:

$$\log M_{non\_sh} = \log M_{sh} - \gamma \log T_{sh} \quad \text{(formula 4)}$$

where $M_{non\_sh}$ is an impact ionization rate when influence of self-heating is removed, $M_{sh}$ an impact ionization rate when influence of self-heating is not removed, $T_{sh}$ an extracted self-heating temperature, and γ is a coefficient;

vi) obtaining constant coefficients A and B in a standard Hu model as shown in formula 5 by using a fitting method according to the respective parameters after self-heating correction, the lifetime $\tau_{non\_sh}$, the drain current $I_{d,non\_sh}$ and the impact ionization rate $M_{non\_sh}$, where $M_{non\_sh} = I_{sub,non\_sh}/I_{d,non\_sh}$, predicting the lifetime of the SOI MOSFET device under the bias through formula 6 after the drain current and the substrate current under a certain bias are obtained:

$$\tau_{non\_sh} \cdot (I_{d,non\_sh}/W) = A \cdot (I_{sub,non\_sh}/I_{d,non\_sh})^{-B} \quad \text{(formula 5)}$$

$$\tau'_{non\_sh} = (A \cdot W/I'_{d,non\_sh})(I'_{sub,non\_sh}/I'_{d,non\_sh})^{-B} \quad \text{(formula 6)}$$

where W is a channel width of the device, $I'_{sub,non\_sh}$, $I'_{d,non\_sh}$ and $\tau'_{non\_sh}$ are the drain current and the substrate current after self-heating correction, and the lifetime after influence of self-heating is removed, respectively, which are to be predicted under a bias condition.

2. The method according to claim 1, wherein that, in the step i), the determining the relationship of the gate resistance of the SOI MOSFET device varying as the function of the temperature comprises:

i) as for the SOI MOSFET having five terminals, two ends of a gate are opened with contact holes respectively and applied with a voltage Vg1 and a voltage Vg2 respectively when testing a gate resistance; in order to exclude an influence from a gate tunneling current on detection of a gate current Ig1 and Ig2, the voltages Vg1 and Vg2 are set as Vg1=Vg+ΔVg and Vg2=Vg−ΔVg, where Vg is the stress bias applied to the gate, and ΔVg takes different values respectively to measure the gate currents Ig1$i$ and Ig2$i$ (i=1, 2, 3, . . . , n); and Rg$_i$=4ΔVg$_i$/(Ig1$_i$+Ig2$_i$) is obtained, where Rg$_i$ is the resistance measured at the ith time; and the gate resistance under a certain temperature and a certain bias is obtained as $$Rg = \sum_{i=1}^{n} Rg_i/n,$$

where n is generally smaller than 5;

ii) performing the step i) at different wafer temperatures when the stress bias for the gate voltage Vg and the drain voltage Vd are zero, so as to obtain a relationship of the gate resistance varying as the function of wafer temperature in the absence of self-heating effect, where the relationship is represented by the resistance-temperature relationship coefficient α:

$$\alpha = \frac{Rg(T_{high}) - Rg(T_{ref})}{T_{high} - T_{ref}} \qquad \text{(formula 7)}$$

where $T_{ref}$ is a reference temperature, $Rg(T_{ref})$ is a gate resistance measured at the reference temperature, $T_{high}$ is a temperature higher than the reference temperature, and $Rg(T_{high})$ is a gate resistance measured at $T_{high}$;

iii) performing the step i) at different wafer temperatures when the stress bias for the Vg and Vd are larger than zero, so as to measure the different gate resistances caused by different self-heating effect under different biases; and calculating the self-heating temperature $T_{sh}$ by the resistance-temperature relationship coefficient α and the measured resistance Rg:

$$T_{sh} = \frac{Rg(T_{high}) - Rg(T_{ref})}{\alpha}. \qquad \text{(formula 8)}$$

3. The method according to claim 2, wherein, in the step i), a value of Vg is much larger than ΔVg, and the value of ΔVg is smaller than 50 mV.

4. The method according to claim 1, wherein, in the step i), the stress for testing the reliability is a hot electron injection stress.

5. The method according to claim 1, wherein, the step ii), the parameter representing the lifetime of the device is a maximum transconductance $G_{m\_max}$ or a saturation drain current $I_{dsat}$.

* * * * *